United States Patent
Stammermann

(10) Patent No.: US 7,181,720 B2
(45) Date of Patent: Feb. 20, 2007

(54) PROCESS AND DEVICE FOR CIRCUIT DESIGN BY MEANS OF HIGH-LEVEL SYNTHESIS

(76) Inventor: Ansgar Stammermann, Hochhausner Strasse 21, 26121 Oldenburg (DE)

( * ) Notice: Subject to any disclaimer, the term of this patent is extended or adjusted under 35 U.S.C. 154(b) by 328 days.

(21) Appl. No.: 10/857,212

(22) Filed: May 28, 2004

(65) Prior Publication Data

US 2005/0039150 A1    Feb. 17, 2005

(30) Foreign Application Priority Data

May 30, 2003    (DE)    ............... 103 24 565

(51) Int. Cl.
*G06F 17/50*    (2006.01)
(52) U.S. Cl. ............... 716/18; 716/2; 716/8
(58) Field of Classification Search ............ 718/18, 718/2, 8; 716/18, 2, 8
See application file for complete search history.

(56) References Cited

U.S. PATENT DOCUMENTS

| 5,463,555 | A | * | 10/1995 | Ward et al. | ............... 700/96 |
|---|---|---|---|---|---|
| 5,907,698 | A | * | 5/1999 | Kucukcakar et al. | ............ 716/6 |
| 5,912,819 | A | * | 6/1999 | Kucukcakar et al. | ............ 716/19 |
| 6,026,219 | A | * | 2/2000 | Miller et al. | ............... 703/23 |
| 6,324,679 | B1 | * | 11/2001 | Raghunathan et al. | ......... 716/18 |
| 6,505,339 | B1 | * | 1/2003 | Miller et al. | ............... 716/18 |

* cited by examiner

*Primary Examiner*—Sun James Lin
(74) *Attorney, Agent, or Firm*—Neil A. Steinberg

(57) ABSTRACT

The invention relates to a process and a corresponding device for circuit design by means of high-level synthesis in which a register-transfer description is determined from a system description of a circuit to be designed with an aim of designing the circuit with as little power consumption as possible. Particularly, in order to sufficiently take into account the more and more sharply increasing percentage of power consumption due to connecting wires, an iterative process is proposed in which, immediately after modification of an initial register-transfer description, a modified floorplan is also developed in which it can be recognized immediately whether or not the modification of the initial register-transfer description has brought with it a reduction of the power consumption of the connecting wires.

17 Claims, 15 Drawing Sheets

```
if ( n > m ) then
    tmp := a - b
else
    tmp := (a * b) + c;
end if;
y <= tmp + e;
```

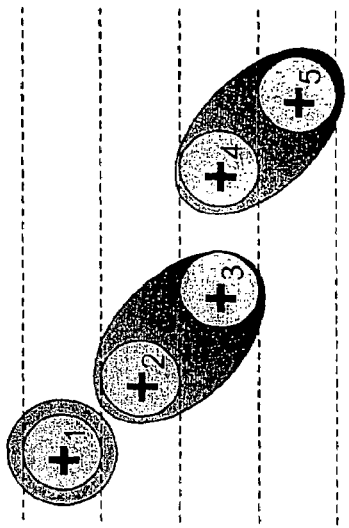
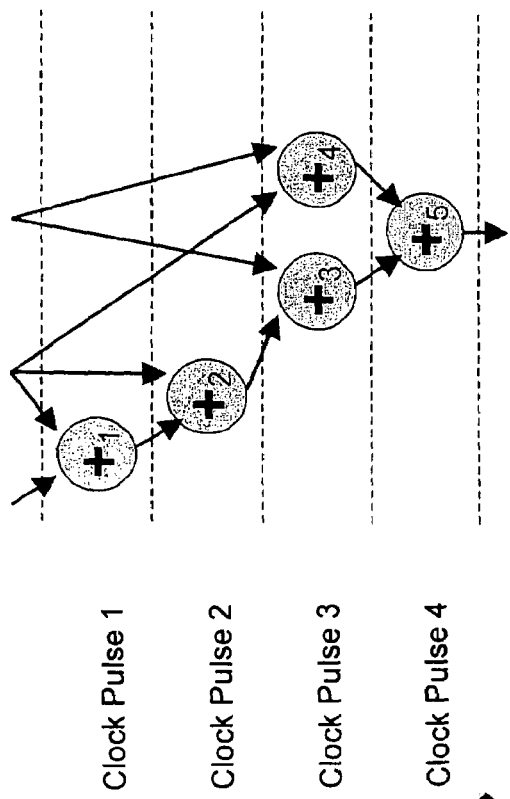
Clock Pulse 1
Clock Pulse 2
Clock Pulse 3
Clock Pulse 4
Fig. 5a
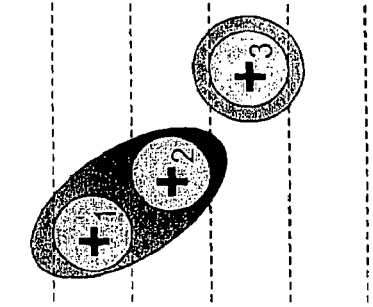
Fig. 5b
Fig. 5c

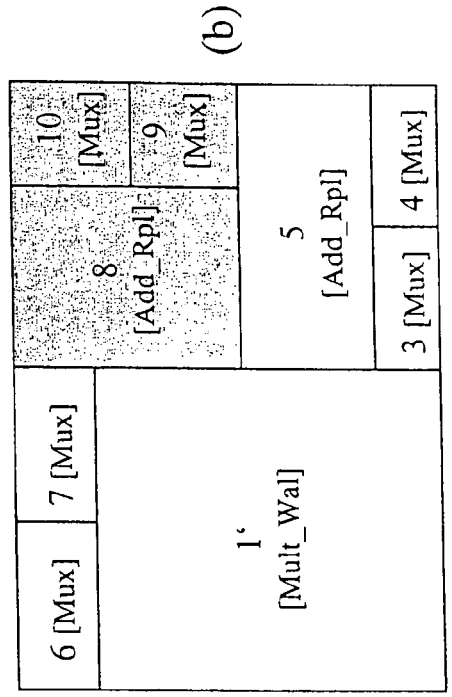
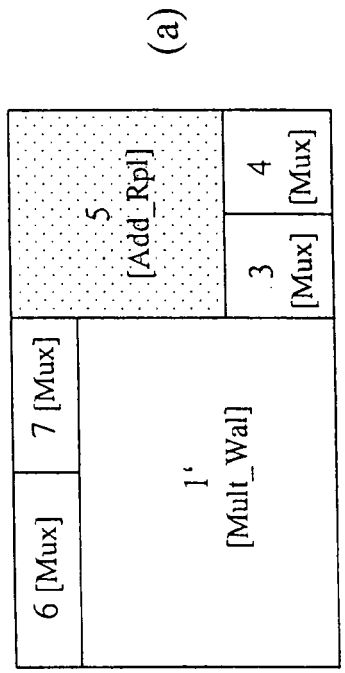
Fig. 16
Split 5 [Add_Rpl]
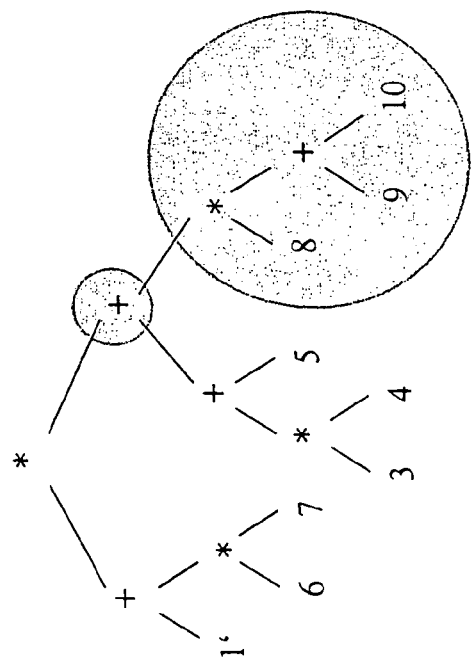
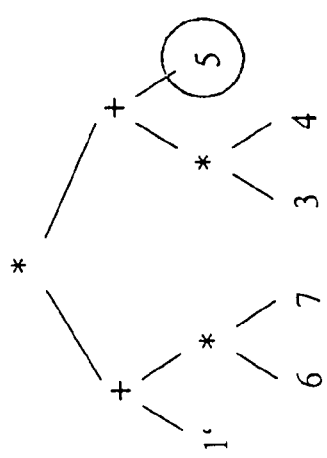

PROCESS AND DEVICE FOR CIRCUIT DESIGN BY MEANS OF HIGH-LEVEL SYNTHESIS

The present invention relates to a process and a corresponding device for circuit design by means of high-level synthesis in which a register-transfer description is determined from a system description of the circuit to be designed. Furthermore, the invention relates to a computer program for the implementation of the process on a computer as well as storage means on which such a computer program is stored.

In recent years, the integration density as well as the clock time of microelectronic circuits has increased enormously. A semiconductor chip today consists of several million gates. This development has led to the power consumption of such systems becoming an increasingly important criterion in the design process for the circuit. A higher power consumption reduces the operating lifetime of the battery in mobile applications, increases the production costs, and reduces the reliability of the circuit.

In the extremely complex design of microelectronic circuits, the problem arises of estimating the effects of different design alternatives on power consumption. Design decisions in a very early phase of the development process in which the design is still in a very abstract system description, often also called the algorithmic abstraction level, have the greatest influence on the power consumption. However, known design tools require a very advanced design process in order to perform a power consumption analysis. Consequently, several nearly complete passes through the development process are necessary as a rule in order to obtain an acceptable circuit. Such a procedure is very time-consuming, cost-intensive, and not compatible with shorter and shorter innovation cycles in circuit design. It is thus the aim in circuit design to perform a power consumption analysis and optimization as early as the algorithmic abstraction level. In so doing, different circuit variants should be treated flexibly and the influence of the data to be processed on the power consumption should be able to be modulated.

High-level synthesis denotes the automated circuit synthesis in which there is a system description, i.e. an application to be synthesized, on a high-level language plane. High-level synthesis is a type of hardware compilation that generates corresponding circuits from programs in languages such as, for example, C or Java, or alternatively hardware description languages such as VHDL or Verilog. The result of a high-level synthesis is still not a transistor layout but rather a register-transfer description which in turn is processed by subsequent synthesis steps. Along with this, high-level synthesis includes different optimization steps. In a module selection step, it is decided which individual modules (for example, adder or multiplier modules) should be used. In a scheduling step, the scheduling of the individual operations is developed. In an allocation step, the corresponding resources are prepared. In a binding step, the allocation of the available resources is performed.

In these processes, numerous design decisions are to be made. Among the questions presenting themselves with regard to power consumption are the following:
1. Which algorithm is the best?
2. How does the best architecture for an algorithm look?
3. Which is the best architecture for a component?
4. How does the bit width of a component influence the power consumption?

It is known that, for example, in current CMOS technology (0.1 μm), approximately 80 to 95% of power consumption arises through the charging and discharging of capacitances. The capacitance contributes linearly to the power consumption. Due to the increasing integration density and miniaturization, the relative percentage of the input capacitances of gate components is less and less compared to the capacitance of the connecting wires, which is determined predominantly by the length of the connecting wires. This means that the percentage of the power consumption caused by the connecting wires increases more and more sharply and must therefore be taken into account more seriously in circuit design, which, in turn, means that the geometry of a design must be taken into account as early as possible.

A known process for circuit design by means of high-level synthesis, in which the power consumption due to the connecting wires is taken into account, is known from L. Zhong, H. K. Jha, "Interconnect-aware High-Level Synthesis for Low Power," ICCAD 2002. In this process, starting from an initial realization of a register-transfer description and a floorplan of the needed circuit area, several sequential temporary realizations are formed by changing the initial register-transfer description by means of an allocation and binding operation. A modified floorplan is then developed for the last generated temporary realization of the register-transfer description. With the aid of this modified floorplan it is then evaluated, together with the last register-transfer description, whether the power consumption occurring therein is less than the power consumption occurring in the initial realization. It is thus attempted iteratively to find an optimal realization of a register-transfer description.

In this process, however, the problem occurs that an optimum is possibly not found since a series of changes of the initial register-transfer description is first performed and only at the end is a new floorplan developed with the aid of which the power consumption is then determined and compared to the power consumption of the previous realization. In the selection of the register-transfer description, the power consumption caused by the wire length is not taken into account since a corresponding floorplan is still not available. Furthermore, in this process, the new floorplan must be developed completely anew each time, which is quite time-consuming.

A similar process is known from U.S. Pat. No. 6,493,863 B1. In this process, too, the floorplan must be developed completely anew after each iteration. Further similar processes are known from U.S. Pat. Nos. 5,557,531 and 6,314,552 B1.

The present invention is thus based on the objective of specifying an improved process and a corresponding device for circuit design by means of high-level synthesis in which the disadvantages described are avoided and with which an optimized realization can be found which has reduced computational expenditure and at the same time greater reliability.

This objective is realized according to the invention by a process according to Claim 1, which comprises the following steps:

a) generation of a data structure representing the system description, b) determination of a schedule of the operations for the accomplishment of the objective by means of a scheduling operation, c) determination of an initial register-transfer description by means of an allocation and binding operation, d) determination of an initial floorplan for the needed circuit area, e) determination of the initial power consumption occurring in the initial register-transfer description and the initial floorplan, f) determination of a modified register-transfer description by a single change of the initial register-transfer description by means of an allocation and binding operation, g) modification of the initial floorplan to obtain a modified floorplan reflecting the modified register-transfer description, h) determination of the modified power consumption occurring in the modified register-transfer description and the modified floorplan, i) use of the modified register-transfer description, the modified floorplan, and modified power consumption as new initial register-transfer description, new initial floorplan, and new initial power consumption if the modified power consumption is less than the initial power consumption, and j) iteration of steps f) to i) until a termination criterion is met.

A corresponding device is specified in Claim 14. A computer program with computer program means for causing a computer to execute the steps of the process according to the invention when the program is running on a computer is specified in Claim 15. The invention also relates to a storage means, particularly an optical or magnetic data medium such as a CD or DVD, on which such a computer program is stored. Preferred developments of the invention are specified in the subordinate claims.

The invention proceeds from the insight that it is advantageous, immediately after each change of the previous register-transfer description, to also determine the correspondingly modified floorplan. This has, on the one hand, the advantage that the modified floorplan does not have to be developed completely anew but rather can be obtained from the previous floorplan by performing a change which corresponds to the performed change of the previous floorplan, which clearly results in less computational expenditure and computational time. The modified floorplan is therefore obtained from the initial floorplan by modification so that the modified floorplan reflects the register-transfer description modified in the previous step.

Furthermore, this process offers the advantage that, since immediately after each change of the register-transfer description a modified floorplan is thus also available, the corresponding modified power consumption can be determined immediately, that is, the change in power consumption occurring due to the change of the register-transfer description, particularly the change of the power consumption for the wires, is immediately recognizable, namely from the modified floorplan, so that it can thus also be decided immediately whether the modified register-transfer description represents a realization which is better with regard to power consumption than the previous register-transfer description, and in that case should be accepted as the new initial register-transfer description for the next step in the iteration. The iterations in the process according to the invention therefore serve to determine a register-transfer description which is optimized with regard to power consumption, where in each iteration it is tested at the end whether the modified register-transfer description determined in the current iteration and the floorplan determined should be used as the new initial register-transfer description and initial floorplan for the next iteration, or whether the register-transfer description and the floorplan of the previous iteration should also be used further as the initial register-transfer description and floorplan in the next iteration.

The starting point of the process according to the invention is a system description of the circuit to be designed, for example, a behavior description of the circuit from which a data structure representing the system description, preferably a control data flow graph, is generated which is then used for the further operations.

In a preferred development it is provided that, for the modified floorplan, a floorplan optimization is performed before the modified power consumption is determined. In this way, the modified power consumption can be determined still more precisely, or the power consumption caused by the wire lengths is reduced by such a floorplan optimization, since the resources used therein are essentially disposed so that the wire lengths are minimized as much as possible.

Alternatively, it is provided in a development of the invention that a floorplan optimization is only performed for a modified floorplan replacing the previous initial floorplan. Compared with the previous development, computational time is thus spared, since a floorplan optimization is not performed for each floorplan.

Further developments provide that either the connected wire length is minimized or the connected capacitance is minimized. In both developments, the wire length is multiplied by the switching activity of the wire, for which, however, according to the second development the capacitance must first be determined from the wire length with a capacitance model.

As termination criterion a maximal number of iterations, a maximal computational time, a minimal power consumption, and/or a combination thereof is used.

According to a further development of the invention it is provided that in step i) the modified register-transfer description, the modified floorplan, and the modified power consumption also replace the initial register-transfer description, the initial floorplan, and the initial power consumption when the modified power consumption is greater than the initial power consumption provided that the difference between the initial power consumption and the modified power consumption does not exceed a predefined power consumption value and the number of iterations have not exceeded a predefined iteration value.

However, progressively worse realizations can also be accepted, depending on the magnitude of the difference of the power consumption or the number of iterations, where the process can be structured so that the probability thereof decreases with increasing difference and number.

In this way, it is achieved that a realization which provides a greater power consumption is accepted with decreasing probability as the difference of the power consumption and run time of the iterations increases. For example, the probability that a poorer realization is accepted is defined as $e^{-(modified\ power\ consumption - initial\ power\ consumption)/T} = e^{-(difference\ of\ the\ costs/T)}$. The value T, often also denoted as temperature, decreases with the number of iterations and/or advancing run time. It is thus also achieved that with increasing run time, the probability decreases of accepting poorer realizations with regard to power consumption, and that slight increases of power consumption are more likely to be accepted than large increases. In this case, the initial temperature should be selected so that at the end of the run time the expression $e^{-(difference\ of\ the\ costs/T)}$ is nearly equal to zero.

Advantageously, the modified register-transfer description and the modified floorplan are determined by means of a non-deterministic, iterative optimization process, particularly by means of a simulated annealing process. A simulated annealing process is a standard process used in the field of circuit design. The aforementioned formula $e^{-(\text{difference of the costs}/T)}$ is a component of this process.

It is an iterative process for the solution of optimization problems. Along with solutions which reduce the "costs" to be optimized (here the power consumption), solutions which increase the costs are also accepted within limits. This property permits heuristics to also escape from local minima, where preferably the probability of accepting a realization with increased costs decreases with increasing run time.

In a further development, it is provided that a modification is chosen for the modification of the register-transfer description which has maximal prospects for success with regard to a reduction of the power consumption and/or which has caused reduction of the power consumption in previous iterations. For this, all the previous modifications of the register-transfer description and the corresponding changes of the power consumption are recorded. The type of modification is therefore preferably not selected entirely randomly but rather chosen in a goal-oriented manner, which leads to a saving of computational time and provides an optimal result more quickly.

For the determination of the power consumption of wires of a register-transfer description, a capacitance model is preferably used and the wire length goes into it. In addition, the number of vias, the number of pins, and/or the type of register-transfer components to be connected can be used for the improvement of the capacitance model, where the individual parameters are preferably each weighted with a separate technology-dependent factor. Power consumption can thus be determined with particular precision.

The invention will be explained in more detail in the following with the aid of the drawings.

Figure 7:
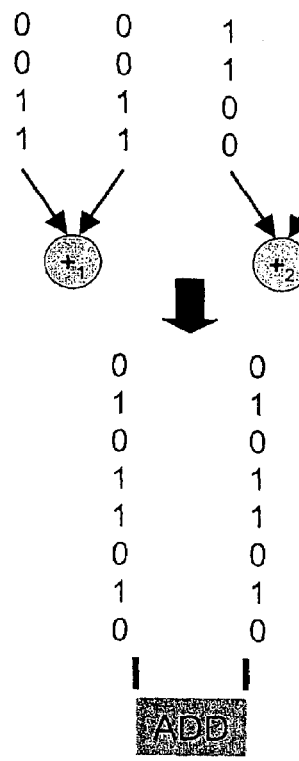
Figure 8A:
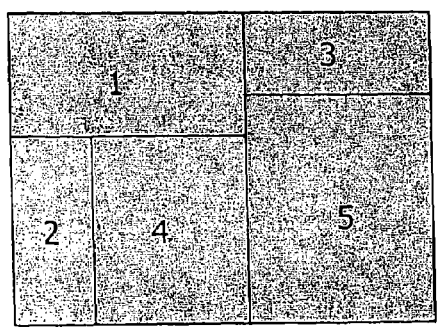
Figure 8B:
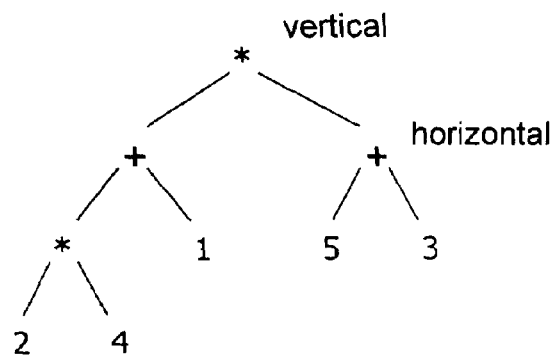
Figure 9:
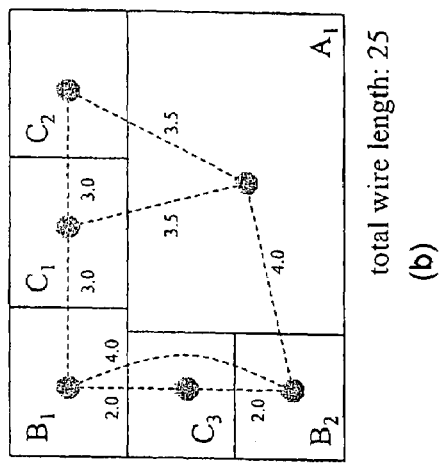
Figure 9:
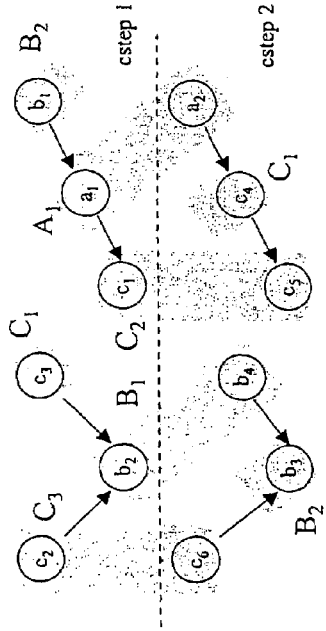
Figure 9:
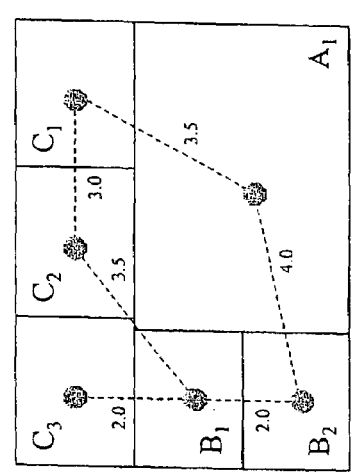
Figure 9:
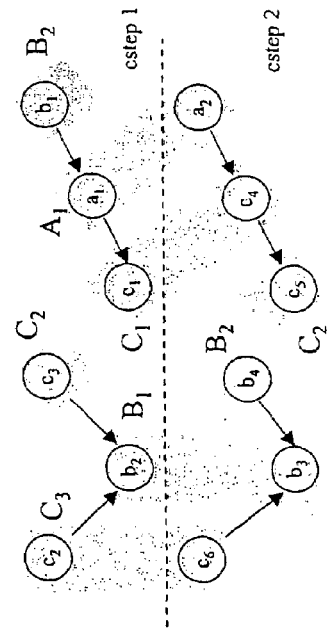
Figure 10:
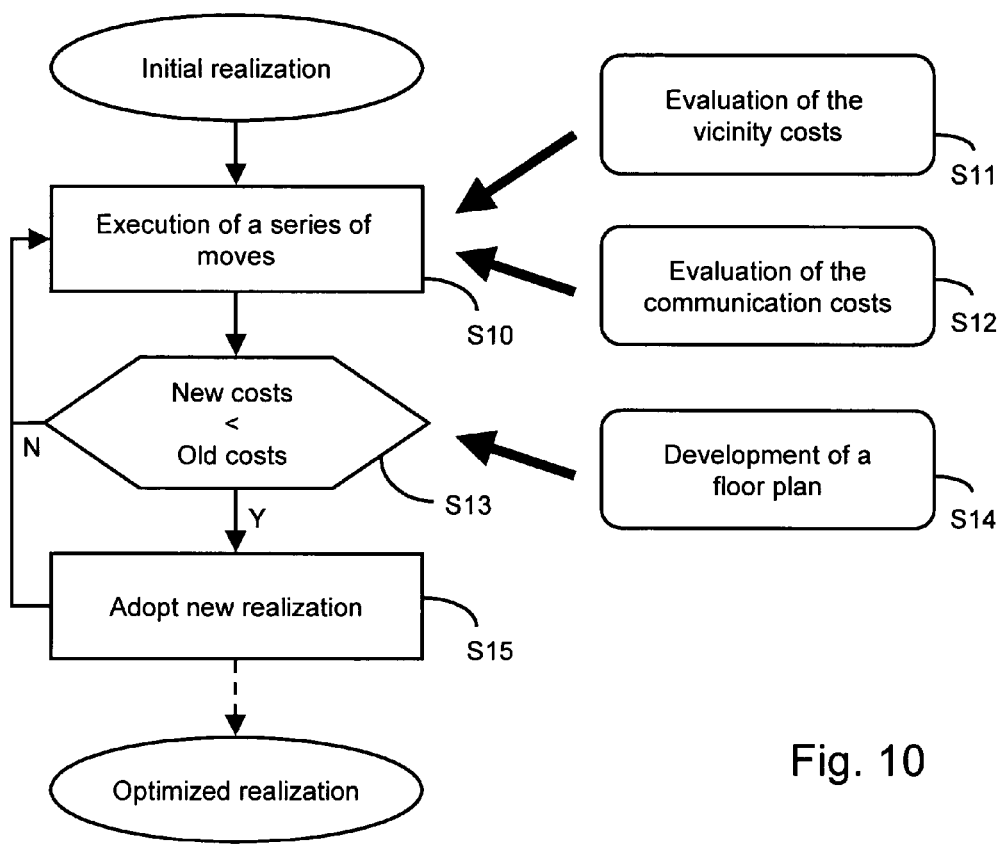
Figure 11:
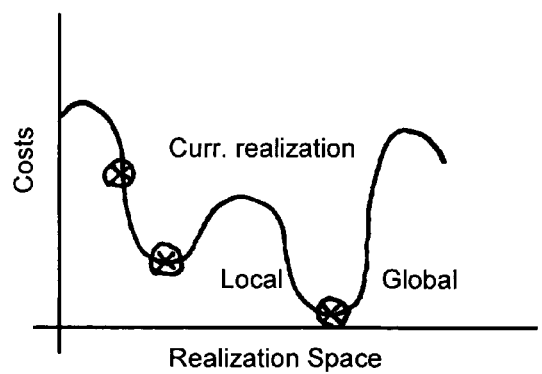
Figure 12:
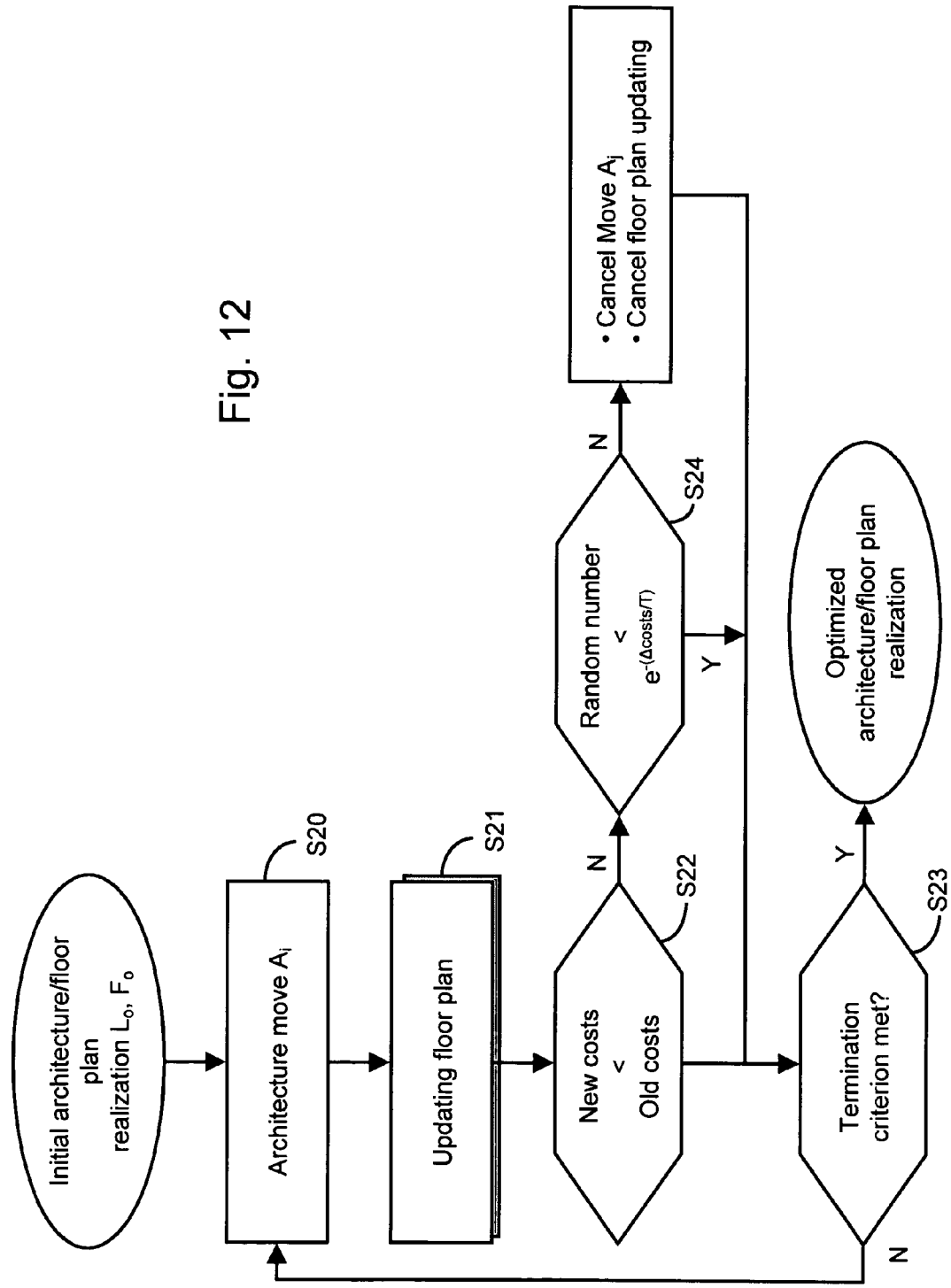
Figure 13:
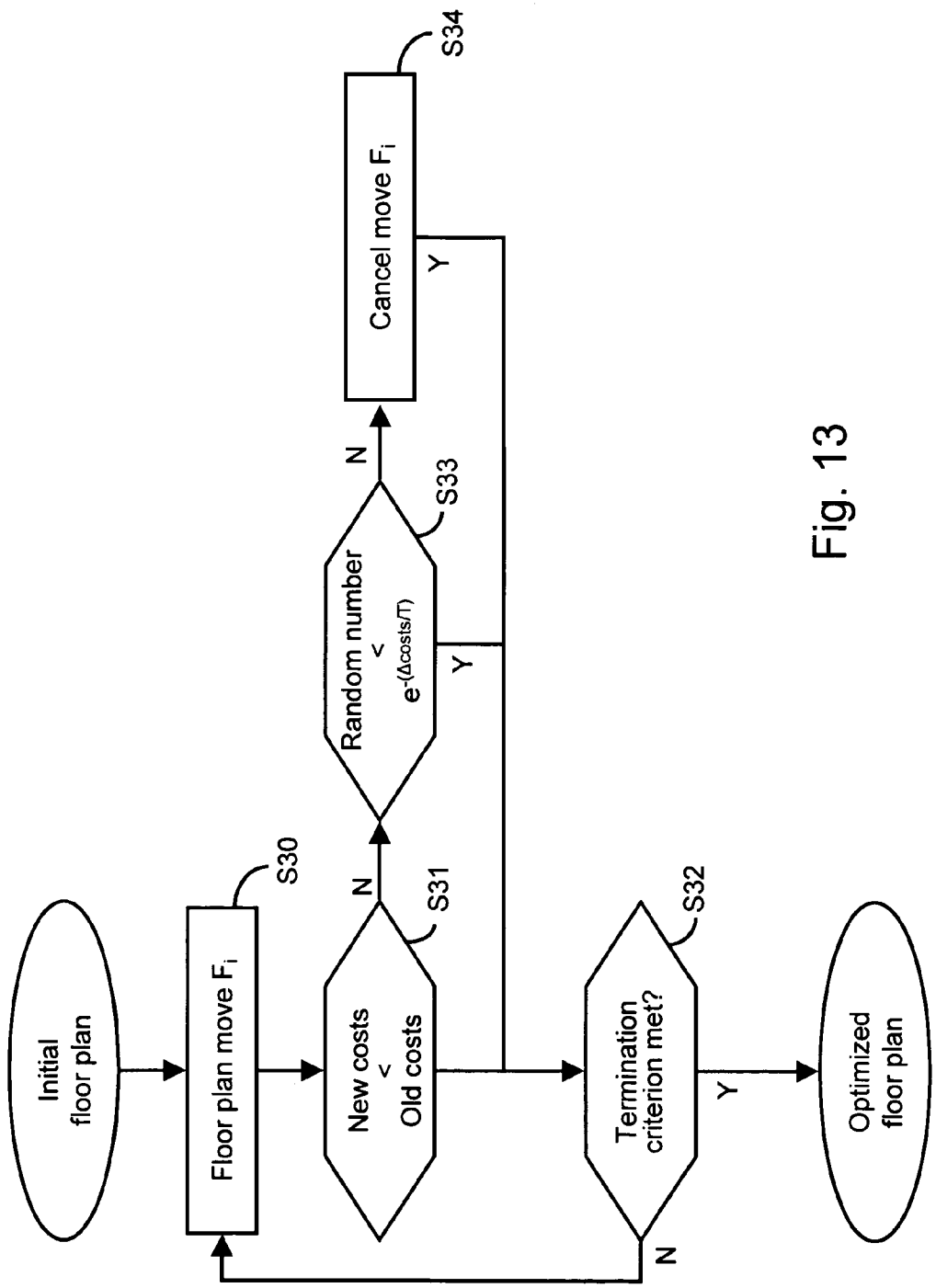
Figure 14:
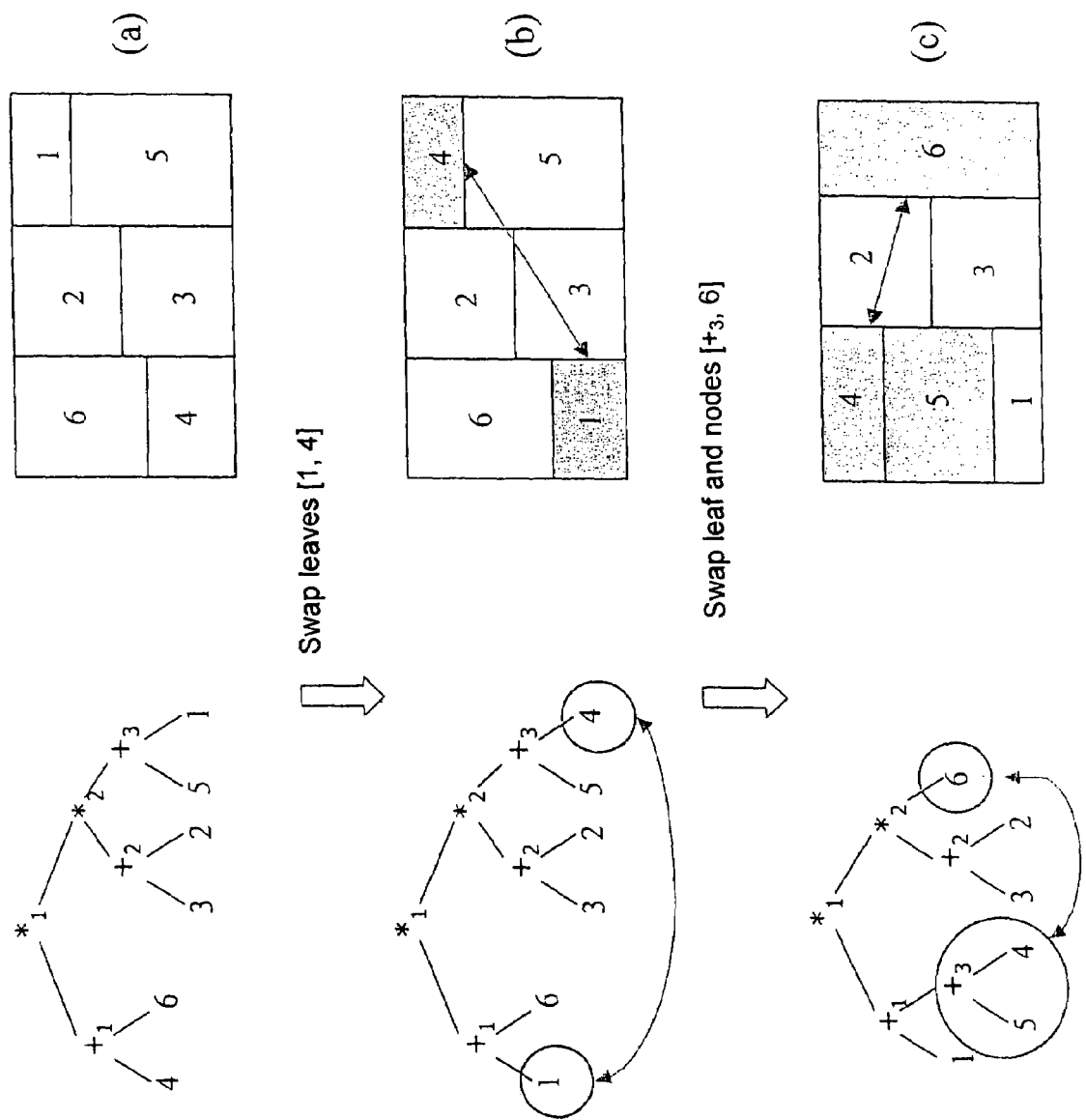
Figure 15:
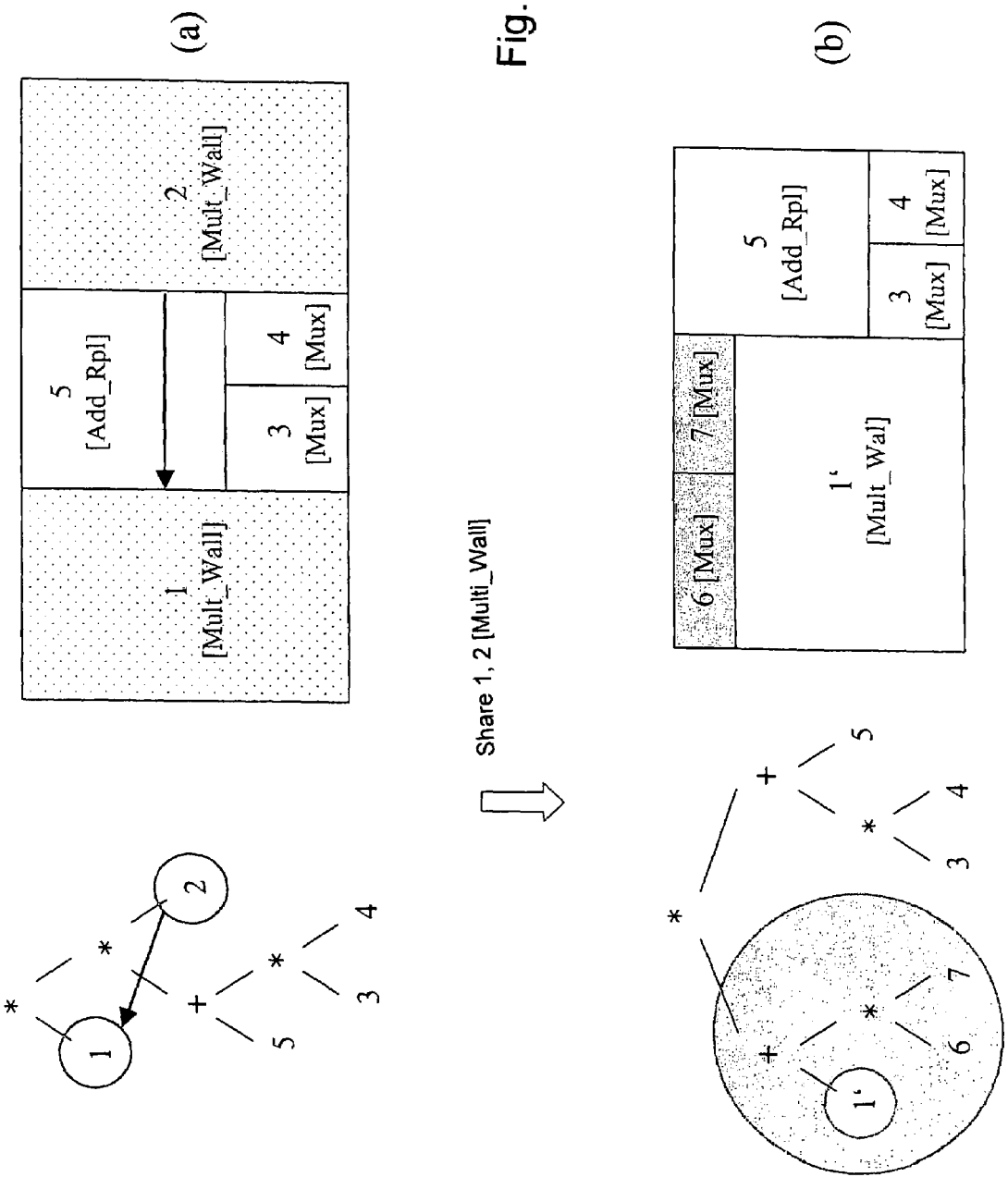
Figure 17:
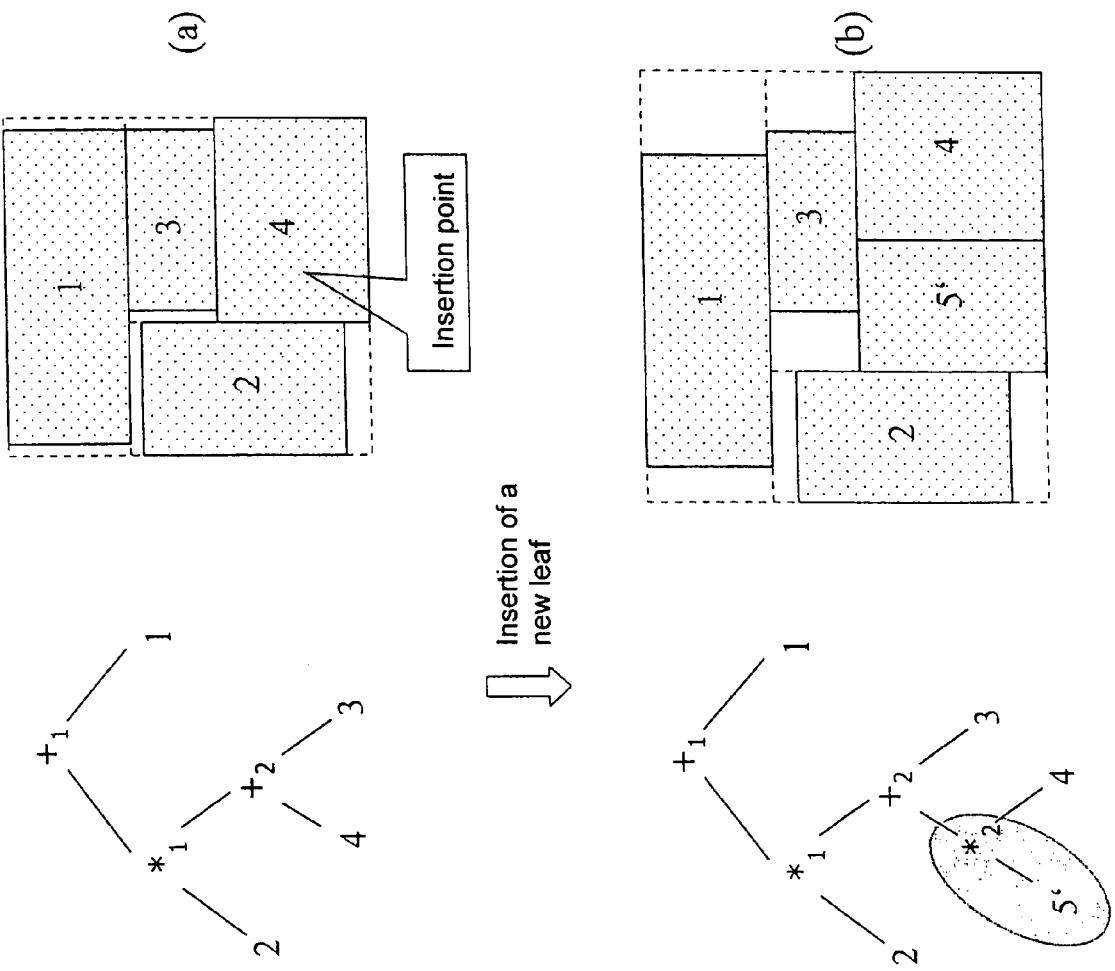
Figure 18:
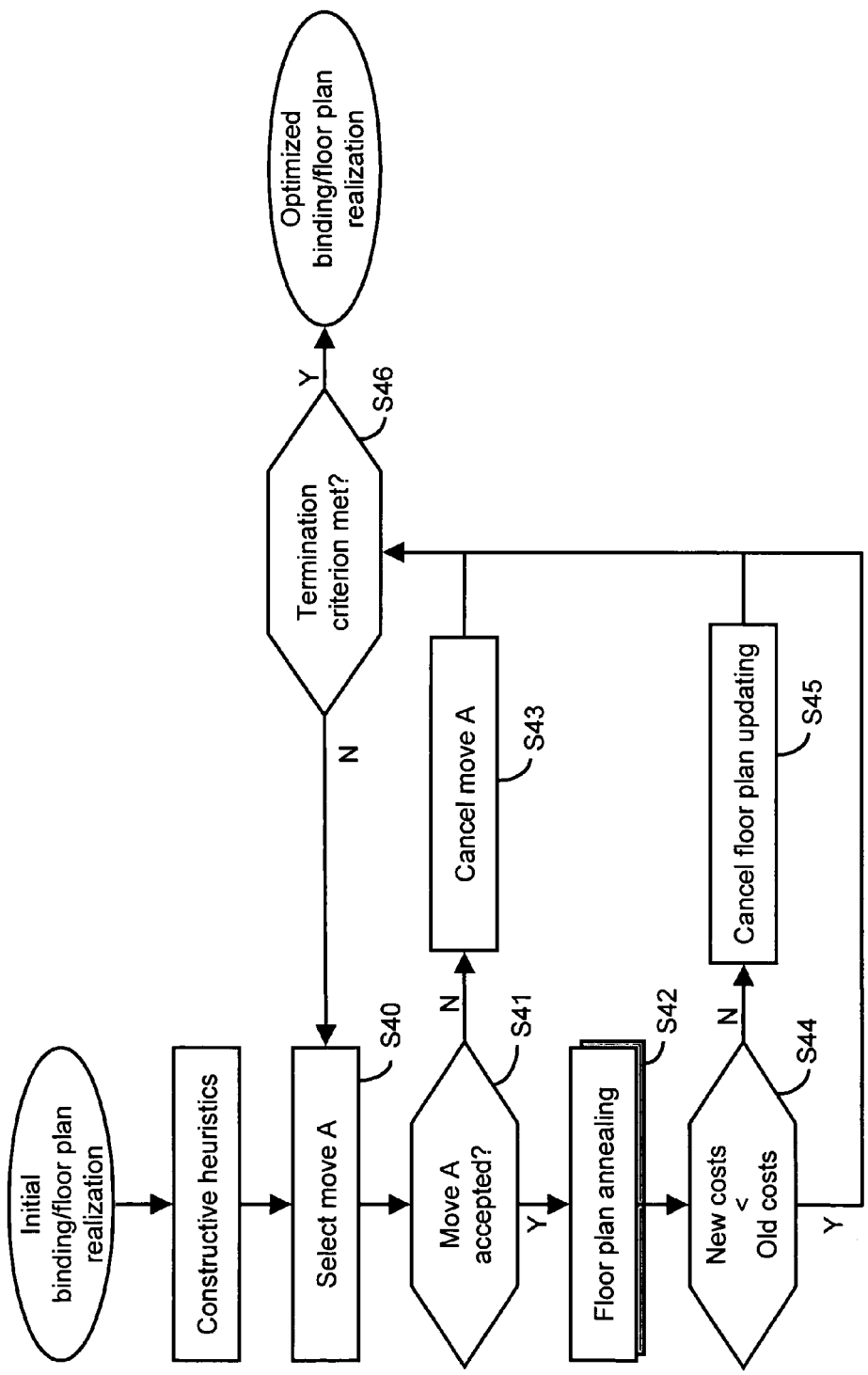
Figure 19:
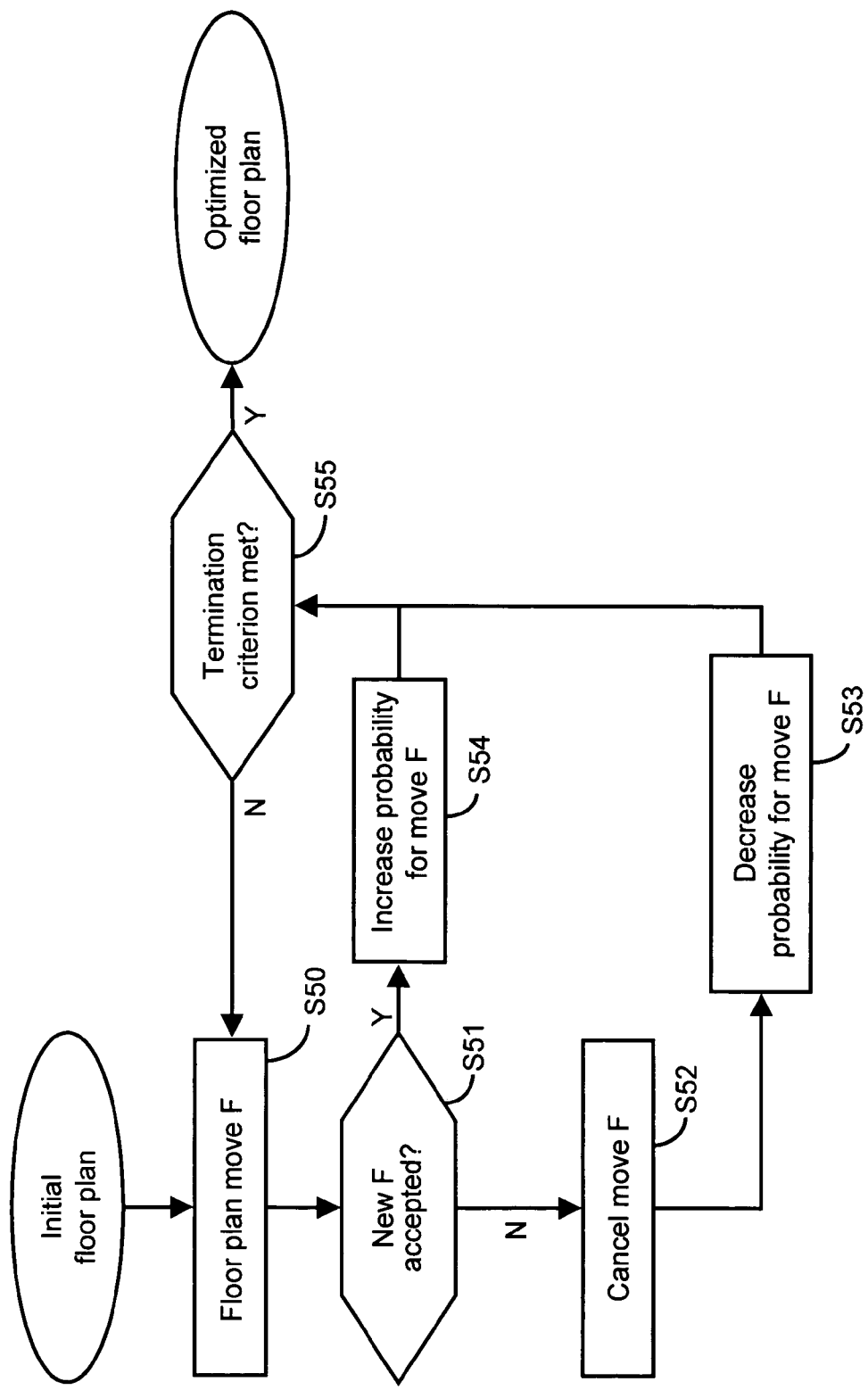

FIG. 5 explains a scheduling, allocation, and binding operation,

FIG. 6 explains the generation of a register-transfer network list with the aid of two examples, FIG. 7 explains the influence of the binding and allocation operation on the power consumption, FIG. 8 shows an example of a floorplan, FIG. 9 explains the influence of a change of the binding on the floorplan, FIG. 10 shows a flow diagram of an additional process for circuit design, FIG. 11 explains the optimization problem on which the invention is based, FIG. 12 shows a flow diagram of the process according to the invention for circuit design, FIG. 13 shows a flow diagram of the process for the optimization of the floorplan according to the invention, FIG. 14 explains the influence of a swap operation on the floorplan, FIG. 15 explains the influence of a sharing operation on the floorplan, FIG. 16 explains the influence of a splitting operation on the floorplan, FIG. 17 explains the influence of the insertion of a new leaf on the floorplan, FIG. 18 shows in a flow diagram an additional development of the process according to the invention, and FIG. 19 shows in a flow diagram an additional development of the process for the optimization of the floorplan.

Figure 1:
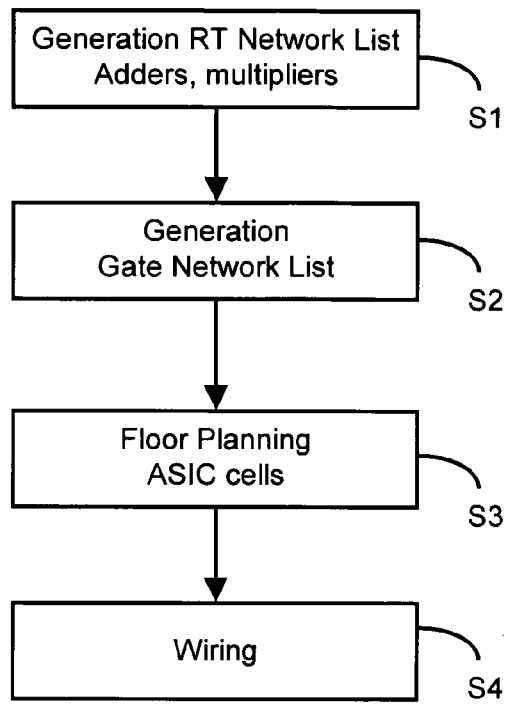
FIG. 1 shows a flow diagram for a known process for circuit design.

FIG. 1 shows, as a flow diagram, the rough steps of a traditional circuit design process. Starting from a system description, e.g. a behavior description, of the circuit to be designed, an RT netlist (register-transfer netlist) is generated therein in a first step S1, in which, for example, it is determined how many and what adders or multipliers are to be used. From this, a gate netlist is generated in the following step S2, from which in turn in step S3 a floorplan is generated, where suitable partial areas of the circuit area, so-called ASIC cells, are allocated to functional units. Finally, the wiring is defined in step S4. In so doing, the degree of detailing increases with each step.

Figure 2:
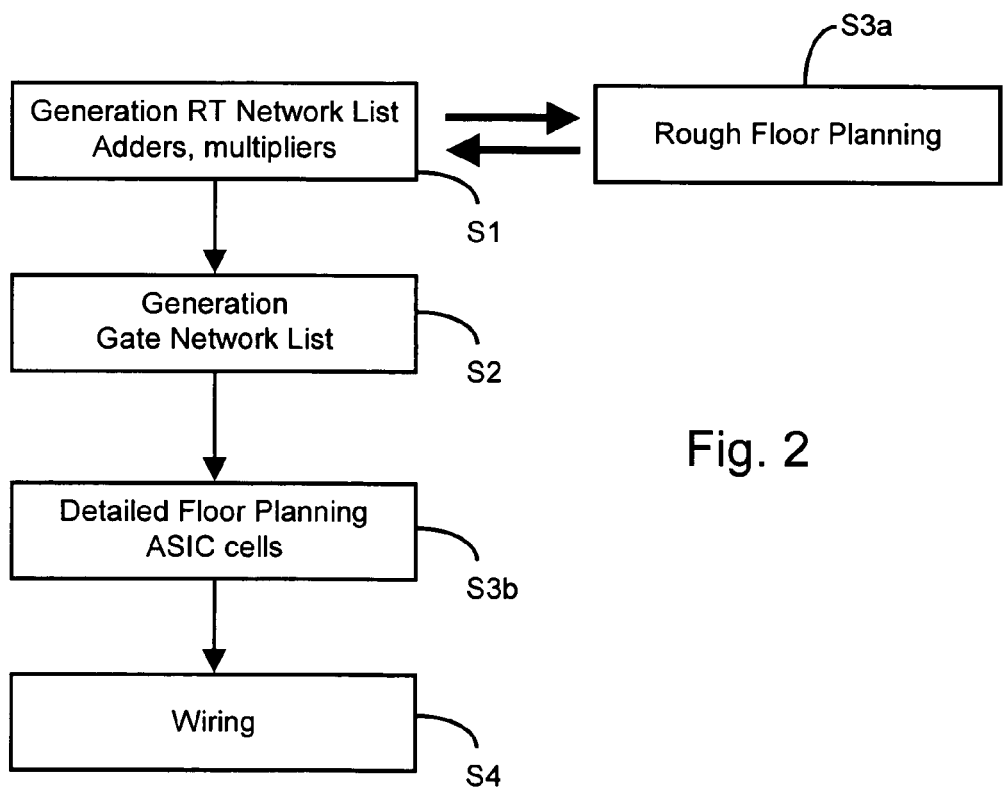
FIG. 2 shows a flow diagram for another known process for circuit design.

A flow diagram of an additional known process for circuit design is shown in FIG. 2. Unlike the process shown in FIG. 1, the preparation of a rough floorplan (step S3a) is done therein even during the generation of the RT netlist in step S1, said rough floorplan being developed in detail later in step S3b after the final RT netlist and the gate netlist have been developed. This has the advantage that even in the generation of the RT netlist, the influence on the circuit area does not fail entirely to be taken into account.

Figures 3, 4:
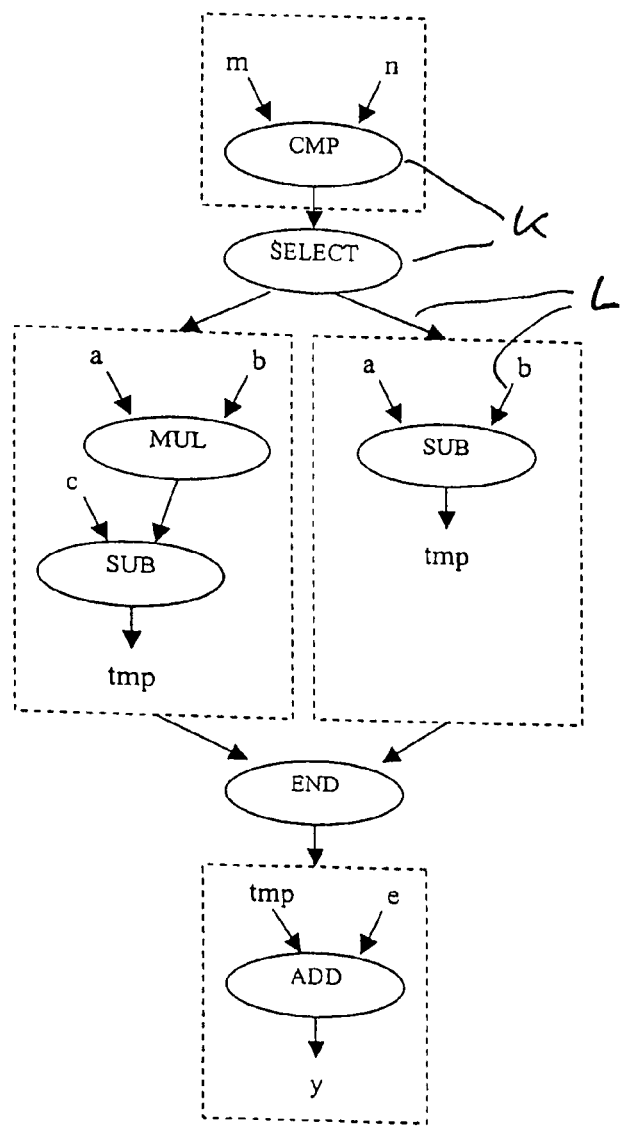
FIG. 3 shows an example of a process description.
FIG. 4 shows an example of a control data flow graph.
Figure 6B:
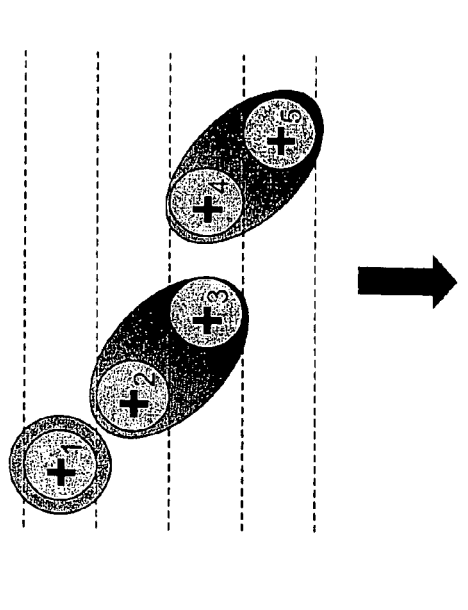
Figure 6B:
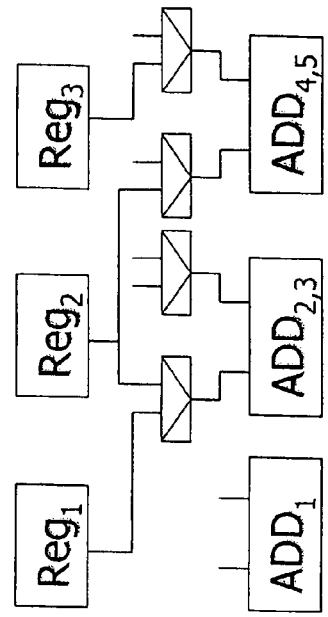
Figure 6A:
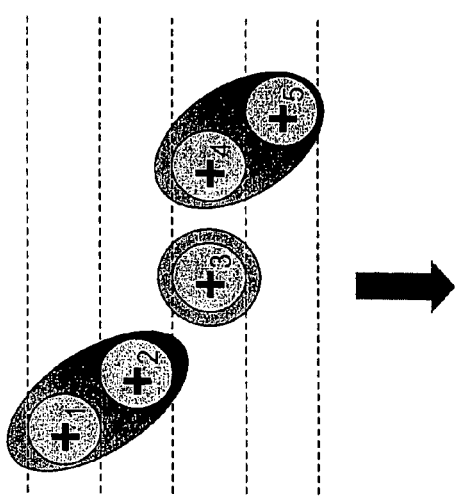
Figure 6A:
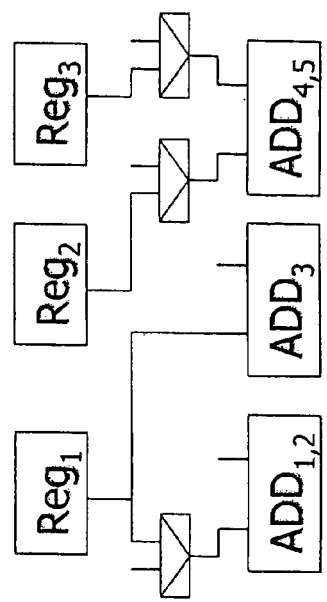

In the following, the individual steps which are run through in the design of a circuit, the so-called high-level synthesis, are explained in more detail. The designer of the circuit initially has a process description of the circuit to be designed, as is shown by way of example as a computer program in FIG. 3. From this process description, a control data flow graph, i.e. a data structure representing the process description, is then developed first of all, as is shown in FIG. 4 for the program shown in FIG. 3. This models the data dependencies of the individual operations. The nodes K of this graph model the operators (for example, comparators, multipliers, etc.) and the links L model the data dependencies of the individual operators among themselves.

Essentially three operations are executed for the following generation of the RT netlist (or RT description), namely a scheduling operation, an allocation operation, and a binding operation. In the case of a scheduling operation, as is shown, for example, in FIG. 5a, it is defined in what clock step an operation is to be executed. Thus, the schedule of the operations to be executed is planned. In the case of an allocation operation, the type and number of the components to be used (often also called resources) is determined. In the case of a binding operation, it is finally defined which operation should be executed on what resource. Thus, the operations or variables are mapped onto individual resources. For these operations' different results, shown in FIGS. 5b and 5c, it has thus been determined that, in each of the two cases, three adders should be used, where in the realization shown in FIG. 5b the additions 1 and 2 or 4 and 5 are intended to be executed with the same adders, as is illustrated by corresponding bordering, while this is intended to be the additions 2 and 3 or 4 and 5 in the realization shown in FIG. 5c. FIG. 6 shows, for the realizations shown in each of FIGS. 5b and 5c, an example of a corresponding gate netlist in each of the two cases.

It is the aim of the circuit design, among other things, to design a circuit which comprises the lowest possible power consumption. That the allocation and the binding operation have an influence on the power consumption of the components is intended to be explained with the aid of FIG. 7. Let it be assumed that two 1-bit variables with the input currents (0, 0, 1, 1) are mapped onto a first adder and two additional 1-bit variables with the input currents (1, 1, 0, 0) are mapped onto a second adder. If these two data currents are now supposed to be shared in order to realize the two adders by a single adder, as is shown below in FIG. 7, then it can be clearly seen that the switching activity at the input of the common adder ADD (and the corresponding wire) is changed. Generally, the switching activity at the input of a resource and on the corresponding wire increases or decreases by the sharing of the data currents. Furthermore, the length and/or capacitance of a wire can increase or decrease as a result. All this has an influence on the power consumption of a circuit. In order to estimate the power consumption effectively, the power consumption of the resources and the capacitance of the wires between the resources must be taken into account along with the switching activity.

In order to be able to estimate the power consumption that is caused by the capacitance of wires in a circuit, so-called floorplans are used. In these, a partial area of the entire area of the semiconductor circuit is allocated starting from an RT netlist of the function described therein. An example of such a floorplan is shown in FIG. 8a. A partial area is allocated in each of the five individual resources 1 to 5. An efficient representation of such a floorplan can also be made by a binary tree, as shown in FIG. 8b, where a star, "*", symbolizes a vertical transition, and a plus sign, "+", symbolizes a horizontal transition.

FIG. 9 illustrates the effect of different realizations after the binding operation on the length of connection points of an RT network list. Assumed were a control data flow graph and a fixed scheduling with three operators a, b, and c and the corresponding functional units A, B, and C. FIG. 9a shows the results of a first binding operation; FIG. 9b shows the corresponding optimized floorplan. Shaded in gray in FIG. 9a are each of the operators which are mapped onto the same functional unit. In the floorplan, the connecting wires are dotted with their corresponding length shown. FIG. 9c shows the realization after another binding operation. FIG. 9d shows the corresponding floorplan. Here, b3 is now placed on B1, b4 on B2, and c1 on C2. Overall, the total length of the connecting wires decreases in the second realization from 25 (for the realization according to FIG. 9b) to 18 (for the realization according to FIG. 9d), hence by 28% in all. This clearly demonstrates the importance of the power consumption due to the connecting wires and how they can be influenced by different binding operations.

FIG. 10 explains, with the aid of a flow diagram, a known process for circuit design, as is known from the article cited initially by L. Zhong et al. Here, starting from an initial realization of a register-transfer description, several temporary realizations for register-transfer descriptions are determined in sequence (step S10) by a so-called move, i.e. a modification of the previous solution in each case by means of an allocation and binding operation, being executed stepwise in each case. The moves used are not selected in a completely random fashion. With the aid of two heuristics, the moves are chosen in a goal-oriented manner in the sense that the newly arising register-transfer description has wiring costs that are as low as possible.

Thus, the neighborhood costs are determined for each resource of a description (S11). The neighborhood costs of a resource are calculated from the size and number of the encircling resources which should optimally be placed in its immediate vicinity in the floorplan. The background is as follows: the higher the total of the neighborhood costs, the lower the probability that all the resources can be placed optimally. A move is preferred when the new realization leads to lower neighborhood costs, that is, the potential for an optimal floorplan is as high as possible.

Furthermore, the communication costs between two resources are taken into account (S12), which results from the number of wires that connect directly and the switching activity on these wires. A move is preferred when the new realization leads to lower communication costs. For example, the probability that two resources of the same type are shared increases with increasing level of the communication costs.

For the last temporary realization, a floorplan is developed (S14) with whose aid the new realization is evaluated with regard to power consumption taking into account the power consumption caused by connecting wires (step S13). Provided that the costs of the new realization are less than the costs of the previous realization, the new realization is accepted (S15) and, in given cases, if a termination criterion is met, output as an optimal realization. Otherwise, the iteration is performed anew in order to find a better realization.

However, this process has the disadvantage that, for the evaluation of the costs, the floorplan must be developed completely anew. Also in repeated executions of the iteration for the determination of additional temporary realizations an earlier floorplan cannot be reused or modified.

Furthermore, in this process there is the problem that a realization with minimal costs is skipped in some cases, since the power consumption due to connecting wires is only determined for the last realization. This becomes clear in FIG. 11, in which the costs are represented via the realization space. Shown are a current realization, a local minimum and a global minimum. In the known process, it is thus possible that a realization, which represents the global minimum (taking into account the power consumption due to connecting wires), is not selected as economical realization in step S10 (FIG. 10), since without taking into account the power consumption due to connecting wires another realization may have more minimal costs. To avoid this is, among other things, the objective of the invention.

A flow diagram of a development of the process according to the invention is represented in FIG. 12. Not shown therein are a scheduling operation, allocation operation, and binding operation occurring initially, which lead to an initial realization L0 of a register-transfer description (architecture), for which an initial floorplan F0 is also developed. This initial realization L0 of the register-transfer description is subsequently changed in step S20 by execution of a single architecture move A1. A new allocation and binding operation are therefore performed in order to find a modified realization of a register-transfer description. After execution of the architecture move A1, a corresponding modified floorplan is developed in step S21 for the changed register-transfer description, where this modified floorplan does not have to be developed completely anew but rather the change resulting due to the change of the architecture in step S20 can be drawn upon relatively simply in the initial floorplan F0.

Since a modified register-transfer description and a corresponding modified floorplan are thus available, it can be tested immediately in step S22 whether the new (modified) realization is more economical than the old realization, that is, the costs caused by the components used as well as the costs caused by the wiring can be taken into account in this test. Provided that the new (modified) realization is more economical, it is tested in step S23 whether a predefined termination criterion is met. In case this is not the case, the iteration is run through again, beginning at step S20. Otherwise, the realization found to be economical is output as an optimized realization for the register-transfer description and the floorplan is output as an optimized floorplan, with the aid of which the further steps for the design of the circuit are carried out.

Provided that the test in step S22 yields the result that the new (modified) realization is not more economical than the old realization, the iteration can also alternatively be performed anew beginning with step S20, which is not shown in the present development, However, it is also advantageous that realizations are accepted to a limited extent which increase the costs. This characteristic permits heuristics to escape, even from local minima (see FIG. 11). In order to ensure this, a test can be performed as specified in step S23, where, for example, it is tested whether a random number between zero and one is less than the function $e^{-\Delta costs/T}$, where $\Delta costs$ represent the difference between the costs of the initial and the modified realization and T the temperature or the run time of the iterations already done. By this function testing, it is ensured that the probability of accepting a realization with increased costs decreases with increasing run time. Provided that this test yields the result that a realization with increased costs is accepted, the process continues with step S23 and the test of meeting the termination criterion. Otherwise, the architecture move A1 performed in step S20 is undone. Likewise, the updating of the floorplan in step S21 is undone and then the process also continues with step S23.

In the process according to the invention, changes of the register-transfer description, which are executed in step S20, are therefore drawn upon in the floorplan. This is of importance in this respect, since resources can be added or deleted by all the architecture moves. Furthermore, all the architecture moves change the wiring. The previous floorplan is therefore no longer optimal after an architecture move. In the updating of the floorplan occurring in step S21, soft macros are preferably supported. Furthermore, new resources can be optimally inserted into the floorplan. Through this immediate subsequent implementation of the changes in the floorplan, changes of the power consumption due to the connecting wires are immediately recognizable directly in step S22. An optimal realization can therefore be found significantly better and the risk of the skipping of an optimized realization is minimized or even zero. Furthermore, in step S21 the floorplan does not always have to be developed completely anew, but rather can be formed from the previous floorplan after completion of the changes.

Different architecture moves can in principle be executed in step S20 (by a change of the binding and the allocation). In sharing, two resources are combined to form a single resource, where the two resources must be instances of the same type (for example, both adders). In splitting, a resource is divided into two resources. In swapping, the inputs of one operation (not a resource) are exchanged, which is only permitted for commutative operations.

In step S21, the modified floorplan is determined, in principle, by completion of the architecture change from step S20. However, it is also possible in so doing to perform an optimization of the floorplan by means of a so-called floorplan annealing process. Such a process is shown in FIG. 13 as a flow diagram. Starting from an initial floorplan, a so-called floorplan move is performed for this purpose in step S30, therefore a floorplan change, for which purpose different changes are available which are to be explained in more detail in the following. Thereafter, it is tested in step S31 whether through this change the power consumption has increased or not. Since the power consumption of the functional units remains constant in floorplan annealing, it is sufficient to take into account only the power consumption due to the connecting wires.

Provided that the power consumption has become less, it is tested in step S32 whether a termination criterion for floorplan optimization has been met. If this is not the case, the process continues with step S30 and further iterations. Otherwise, the last floorplan with the lowest costs is output as an optimized floorplan. In case the testing the step S31 yields the result that the floorplan change has yielded no reduction of the costs, a similar test is performed in step S33 as in step S24 (see FIG. 12) in order to ensure that even floorplan changes which increase the costs are, in given cases, accepted, in order to escape from local minima. If such a realization should not be accepted, the change F1 in step S34 is undone. In each case the process continues with the test of the termination criterion in step S32.

Each floorplan is evaluated during the optimization process based on the area A and the connection power P with the utilization of a cost function of the form $P+\lambda A$, where $\lambda A$ controls the relative importance of A and P. The connecting lengths can be calculated by calculation of the Manhattan distance for connections between two pins and the so-called minimum spanning tree (MST) for connections with more than two pins. Alternatively, so-called Steiner trees can be used in order to draw data transfer lines. In order to reproduce the clock distribution network (clock tree), a compensated H tree is generated.

Preferably, a changed cost function for the evaluation of the power consumption during circuit design is used according to the invention. The new cost function has the form $P_{FU}+P_{wire}+\lambda A$. Here, $P_{FU}$ is the power consumption of the resources (functional units, multiplexer, and register), $P_{wire}$ the power consumption of the connecting wires, and $\lambda A$ the contribution of the circuit area to the cost function. In the process according to the invention different floorplan changes (floorplan moves) and architecture changes (architecture moves) are thus used in order to iteratively change the register-transfer description, where the corresponding floorplan is also changed in order to be able to evaluate the power consumption as well as possible.

For the floorplan's optimization, explained with the aid of FIG. 13, in the case of fixed architecture different changes of the floorplan can be implemented in step S30. A first possibility for change is the swap of leaves and/or nodes. FIG. 14 shows how changes of this type change the binary tree shown on the left side in each case and shows the effects on the corresponding floorplan. FIG. 14a shows a starting floorplan, FIG. 14b shows the changes after carrying out the swap of the leaves 1 and 4. FIG. 14c shows the effects after, in addition, the nodes +3 and the leaf 6 were swapped.

Along with the floorplan moves shown in FIG. 14, in which the inputs of commutative operations are changed and in which the switching activity in the data path is significantly influenced while the influence on the netlist is nearly negligible, there are changes, so-called architecture moves, which are shown in FIGS. 15, 16, and 17. FIG. 15 shows the effects of a sharing operation. FIG. 15a shows a starting binary tree and a corresponding starting floorplan. FIG. 15b shows the effects of a sharing operation in which two resources 1 and 2 are shared to form a single resource. Such a sharing operation shares in principle two resources as a single resource. For such a change to be valid, the resources must be instances of the same type. Furthermore, the operation executed by the first resource may not overlap in time with the operation executed by the second resource. If the number of sources at one input of a resource is greater than 1, then a new multiplexer is inserted. If the number of sources decreases to 1, then multiplexers are removed accordingly. The common utilization of resources influences the switching activity on the data path as well as the network topology significantly.

The effects of a splitting operation are shown in FIG. 16. Here, a starting floorplan, as well as a starting binary tree, is shown in FIG. 16a. In FIG. 16b the effects of a splitting operation is shown in which the resource 5 is divided into several resources. A splitting operation is thus the reverse of a sharing operation. A single resource is therefore divided into two resources. In so doing, multiplexers can be added or removed. A splitting can occur without taking into account the run time of operations. Along with the potential reduction of the switching activity, these operations increase the possibilities for the application of other sharing operations.

The operations explained in FIGS. 15 and 16 make it possible to generate all possible binding solutions. New components are introduced at their equilibrium point. The equilibrium point is that point at which a new resource would produce the least wire power consumption. In FIG. 17a, this point lies within the left half of the leaf 4. Thus leaf 4 is replaced by a new vertical node with the new leaf 5', which is placed on the left side, while the leaf 4 is placed on the right side (see FIG. 17b). According to the invention, soft macros are supported, that is, leaves are flexible in the length and width ratios. The floorplan thus remains nearly optimal with regard to power consumption of the wiring and the floorplan annealing can therefore be kept very short. The area shown to be unused in FIG. 17b stems merely from the fact that this ratio was limited in order to avoid unrealistic floorplans.

An alternative development of the process according to the invention is shown as a flow diagram in FIG. 18. In contradistinction to the development shown in FIG. 12, the (preferably performed) subsequent optimization of the floorplan is performed here by means of a floorplan annealing process (step S42) after an executed move A (S40) has been accepted in step S41. The changes by move A are immediately subsequently implemented in the floorplan without optimizing the floorplan. Only when move A has been accepted is the floorplan optimized (S42). Furthermore, moves are no longer accepted which increase the costs.

If move A is not accepted in step S41, it is undone once again (S43). Otherwise, after the optimization of the floorplan the cost comparison (S44) is performed. If this yields a negative result, the updating of the floorplan from step S42 is undone once again (S45). Finally, the meeting of the termination criterion (S46) is tested, after which either additional iterations are performed or the optimized realization of the register-transfer description and the floorplan are output. The development, shown in FIG. 18, of the process according to the invention is thus run time-optimized and also permits no poorer realizations as a realization, as is possible in the case of the development shown in FIG. 12 (cf. step S24).

An alternative development of the process for the floorplan optimization (step S42) is shown in FIG. 19 with which floorplan changes F can be chosen in a more goal-oriented manner. Here, it is tested after performing a floorplan change F (S50) whether the change F is accepted (S51). For this, move F must meet no special criterion but rather the probability that move F is selected increases or decreases with its success, as is explained in the following.

In the case that change F is not accepted, it is undone (S52) and the probability for the change F is reduced. Otherwise, the probability for the change F is increased (S54). In both cases, the meeting of the termination criterion is subsequently tested for the optimization of the floorplan (S55), after which either further iterations are performed or the optimized floorplan is output.

The idea here is that the effect of the individual moves depends on the current state of the floorplan. With advancing run time, the use of several moves decreases while on the contrary the use of other moves increases. Thus, it is reasonable rather to select the moves whose current use is greatest. This is achieved by the effect, i.e. accepted or not accepted, being recorded. If a move is accepted, the probability increases that this move will be selected anew (S54). If a move is not accepted, the probability decreases (S53).

To estimate power consumption, a technology-dependent capacitance model is preferably used according to the invention, said capacitance model having been generated by application of a linear regression technique. Depending on the wire length, the number of pins, and the number of branch points, the total capacitance of a connecting wire follows, thus as the sum of the capacitance of the wire length, the capacitance of the pins, and the capacitance of the branch points, where each of these capacitances is multiplied by a technology-dependent factor in the total. The capacitances due to the pins and the branch points arise through additional vias.

With the process according to the invention, the power consumption of the designed circuit can be clearly reduced with respect to the known process in the circuit design without this occurring at the expense of the necessary circuit area. Particularly, the power consumption of the connecting wires can be sharply decreased.

The invention claimed is:

1. A process for circuit design by means of high-level synthesis in which a register-transfer description is determined from a system description of a circuit to be designed, the process comprising the steps of:
   a) generation of a data structure representing the system description,
   b) determination of a schedule for operations for accomplishment of an objective by means of a scheduling operation,
   c) determination of an initial register-transfer description by means of an allocation and binding operation,
   d) determination of an initial floorplan for a needed circuit area,
   e) determination of an initial power consumption occurring in the initial register-transfer description and the initial floorplan,
   f) determination of a modified register-transfer description by a single change of the initial register-transfer description by means of an allocation and binding operation,
   g) modification of the initial floorplan to obtain a modified floorplan reflecting the modified register-transfer description,
   h) determination of a modified power consumption occurring in the modified register-transfer description and the modified floorplan,
   i) use of the modified register-transfer description, the modified floorplan, and the modified power consumption as a new initial register-transfer description, a new initial floorplan and a new initial power consumption if the modified power consumption is less than the initial power consumption, and
   j) iteration of the steps f) to i) until a termination criterion is met.

2. The process according to claim 1 wherein, for the modified floorplan, a floorplan optimization is performed before the modified power consumption is determined.

3. The process according to claim 1 wherein a floorplan optimization is only performed for a modified floorplan replacing the previous initial floorplan.

4. The process according to claim 1, 2 or 3 wherein, as the termination criterion, a maximal number of iterations, a maximal computational time, a minimal power consumption, and/or a combination thereof is used.

5. The process according to claim 1, 2 or 3 wherein, in step i), the modified register-transfer description, the modified floorplan, and the modified power consumption also replace the initial register-transfer description, the initial floorplan, and the initial power consumption when the modified power consumption is greater than the initial power consumption, provided that a difference between the initial power consumption and the modified power consumption does not exceed a predefined power consumption value and the number of iterations have not exceeded a predefined iteration value.

6. The process according to claim 1, 2 or 3 wherein, a probability with which in step i), the modified register-transfer description, the modified floorplan, the modified power consumption also replace the initial register-transfer description, the initial floorplan, and the initial power consumption when the modified power consumption is greater than the initial power consumption decreases with increasing run time and/or increasing the difference between the initial power consumption and the modified power consumption.

7. The process according to claim 1, 2 or 3 wherein the modified register-transfer description and the modified fleerplan are determined by means of a non-deterministic, iterative optimization process.

8. The process according to claim 7 wherein the non-deterministic, iterative optimization process comprises a simulated annealing process.

9. The process according to claim 1, 2 or 3 wherein, for the modification of the register-transfer description, a modification is chosen which has maximal prospects for success with regard to a reduction of power consumption and/or which has caused reduction of power consumption in previous iterations.

10. The process according to claim 1, 2 or 3 wherein the process is developed for minimization of connected wire length or connected capacitance, where the connected wire length is multiplied by switching activity of the connected wire and where, for the minimization of the connected capacitance, the connected capacitance is first determined from the connected wire length with a capacitance model.

11. The process according to claim 1, 2 or 3 wherein, for determination of power consumption of wire of a register-transfer description, a capacitance model is used and length of the wire is a parameter.

12. The process according to claim 11, wherein number of vias, number of branch points, number of pins, and/or type of register-transfer components to be connected are parameters of the capacitance model.

13. The process according to claim 11 wherein the parameter of the capacitance model is weighted with a technology-dependent factor.

14. The process according to claim 1, 2 or 3 wherein a control data flow graph is used as the data structure representing the system description.

15. Computer program with computer program means for causing a computer to execute the steps of the process according to claim 1 when the computer program is running on the computer.

16. Storage means on which the computer program according to claim 15 is stored.

17. A device for circuit design by means of high-level synthesis in which a register-transfer description is determined from a system description of a circuit to be designed, the device comprising:
   a) means for generation of a data structure representing the system description,
   b) means for determination of a schedule for operations for accomplishment of an objective by means of a scheduling operation,
   c) means for determination of an initial register-transfer description by means of an allocation and binding operation,
   d) means for determination of an initial floorplan for a needed circuit area,
   e) means for determination of an initial power consumption occurring in the initial register-transfer description and the initial floorplan,
   f) means for determination of a modified register-transfer description by a single change of the initial register-transfer description by means of an allocation and binding operation,
   g) means for modification of the initial floorplan to obtain a modified floorplan reflecting the modified register-transfer description,
   h) means for determination of a modified power consumption occurring in the modified register-transfer description and the modified floorplan,
   i) means for use of the modified register-transfer description, the modified floorplan, and the modified power consumption as a new initial register-transfer description, a new initial floorplan, and a new initial power consumption if the modified power consumption is less than the initial power consumption, and
   j) means for iteration of the steps f) to i) until a termination criterion is met.

* * * * *

UNITED STATES PATENT AND TRADEMARK OFFICE
CERTIFICATE OF CORRECTION

| | | |
|---|---|---|
| PATENT NO. | : 7,181,720 B2 | Page 1 of 1 |
| APPLICATION NO. | : 10/857212 | |
| DATED | : February 20, 2007 | |
| INVENTOR(S) | : Stammermann | |

It is certified that error appears in the above-identified patent and that said Letters Patent is hereby corrected as shown below:

On page 1, left column, insert --(73) Assignee: ChipVision Design Systems, AG, Oldenberg (DE)--.

Signed and Sealed this

Twenty-fifth Day of November, 2008

JON W. DUDAS
*Director of the United States Patent and Trademark Office*